(12) United States Patent
Suda et al.

(10) Patent No.: US 7,460,969 B2
(45) Date of Patent: Dec. 2, 2008

(54) PULSE WIDTH ADJUSTMENT CIRCUIT, PULSE WIDTH ADJUSTMENT METHOD, AND TEST APPARATUS FOR SEMICONDUCTOR DEVICE

(75) Inventors: Masakatsu Suda, Tokyo (JP); Shusuke Kantake, Tokyo (JP)

(73) Assignee: Advantest Corporation, Tokyo (JP)

( * ) Notice: Subject to any disclaimer, the term of this patent is extended or adjusted under 35 U.S.C. 154(b) by 144 days.

(21) Appl. No.: 11/487,897

(22) Filed: Jul. 17, 2006

(65) Prior Publication Data

US 2008/0018371 A1 Jan. 24, 2008

Related U.S. Application Data

(63) Continuation of application No. PCT/JP2005/000617, filed on Jan. 19, 2005.

(30) Foreign Application Priority Data

Jan. 20, 2004 (JP) .............................. 2004-011412

(51) Int. Cl.
*G06F 19/00* (2006.01)
(52) U.S. Cl. ...................................... 702/89
(58) Field of Classification Search ......... 702/182–185, 702/76–77
See application file for complete search history.

(56) References Cited

U.S. PATENT DOCUMENTS

2007/0139102 A1* 6/2007 Laletin ........................ 327/552

FOREIGN PATENT DOCUMENTS

| JP | 62-147371 | 7/1987 |
| JP | 2001-267891 | 9/2001 |
| JP | 2002-100966 | 4/2002 |
| JP | 2004-326951 | 11/2004 |

OTHER PUBLICATIONS

International Search Report issued in International application No. PCT/JP2005/000617 mailed on Apr. 12, 2005 and English translation thereof, 5 pages.

* cited by examiner

*Primary Examiner*—Edward Raymond
(74) *Attorney, Agent, or Firm*—Osha · Liang LLP

(57) ABSTRACT

There is provided a pulse width adjusting circuit for generating an output signal by adjusting a pulse width of an input pulse signal and outputting the output signal. The pulse width adjusting circuit includes a first delay circuit to output a first delay signal generated by delaying the pulse signal by a certain delay time, a second delay circuit to output a second delay signal generated by delaying the pulse signal by a different delay time from the first delay circuit, and an output section to generate and output the output signal in accordance with the first and second delay signals. Here, the output signal has a pulse width corresponding to a difference between the delay times respectively achieved by the first and second delay circuits.

12 Claims, 9 Drawing Sheets

FIG. 7A  MAIN OPERATION MODE
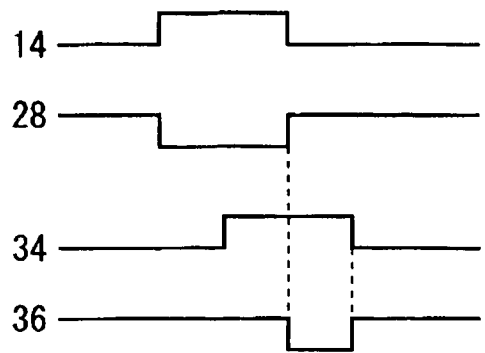
FIG. 7B  FORMER EDGE MEASURING OPERATION MODE
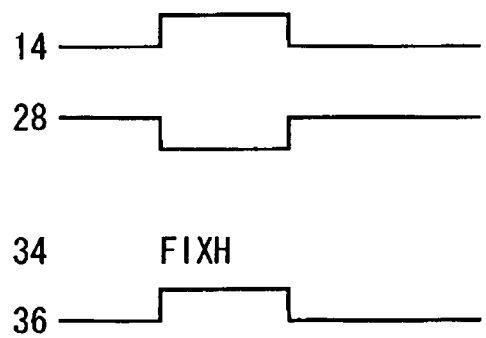
FIG. 7C  LATTER EDGE MEASURING OPERATION MODE
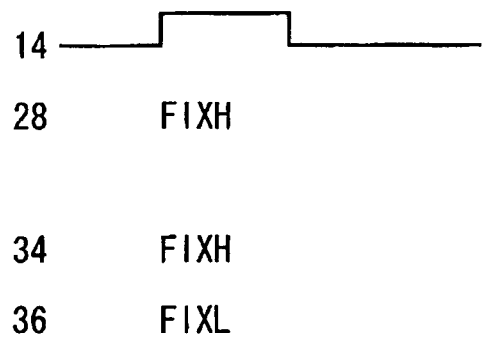

PULSE WIDTH ADJUSTMENT CIRCUIT, PULSE WIDTH ADJUSTMENT METHOD, AND TEST APPARATUS FOR SEMICONDUCTOR DEVICE

CROSS REFERENCE TO RELATED APPLICATION

This is a continuation application of PCT/JP2005/000617 filed on Jan. 19, 2005 which claims priority from a Japanese Patent Application(s) No. 2004-011412 filed on Jan. 20, 2004, the contents of which are incorporated herein by reference.

BACKGROUND OF THE INVENTION

1. Field of the Invention

The present invention relates to a pulse width adjusting circuit and a pulse width adjusting method for outputting an output signal generated by adjusting a pulse width of an input pulse signal. This patent application incorporates herein by reference the contents of a Japanese Patent Application No. 2004-011412 filed on Jan. 20, 2004, if applicable.

2. Related Art

FIG. 1 shows a publicly-known conventional pulse width adjusting circuit 300, which is a circuit for adjusting a pulse width of an input pulse signal. In the pulse width adjusting circuit 300, an adjusting section 302 adjusts the pulse width. The adjusting section 302 includes a variable delay circuit 304 and an AND circuit 306, to generate a pulse signal having a pulse width corresponding to the delay time achieved by the variable delay circuit 304 by performing a logical AND operation between an inverse signal of the input pulse signal and the pulse signal which has been delayed by the variable delay circuit 304 (see Patent Document 1, for example). The pulse signal generated by the adjusting section 302 is delayed by a desired time by the delay circuit 308, to be output to an external device.

In addition, the pulse width adjusting circuit 300 has a function of measuring the pulse width of the pulse signal generated by the adjusting section 302. To perform such measurement, a pulse is generated by using as a reference the falling edge of the pulse signal generated by the adjusting section 302 in the pulse width adjusting circuit 300, and the generated pulse is fed back into the adjusting section 302, so that a loop is formed. Subsequently, the cycle of the formed loop is calculated by using a counter 316. After this, a pulse is generated by using as a reference the rising edge of the pulse signal generated by the adjusting section 302 in the pulse width adjusting circuit 300, and the generated pulse is fed back into the adjusting section 302, so that a loop is formed. The cycle of the formed loop is then similarly calculated by using the counter 316. By calculating the difference between these cycles, the pulse width adjusting circuit 300 obtains the pulse width of the pulse signal generated by the adjusting section 302.

FIG. 2 illustrates the pulse width measuring operation performed by the conventional pulse width adjusting circuit 300. FIG. 2A illustrates the operation performed when the pulse generated by using as a reference the rising edge of the pulse signal is fed back, and FIG. 2B illustrates the operation performed when the pulse generated by using as a reference the rising edge of the pulse signal is fed back. Referring to FIG. 2A, the input pulse is input into the adjusting section 302. The AND circuit 306 subsequently outputs the pulse signal generated by adjusting the pulse width of the input pulse to P1.

The delay circuit 308 delays the pulse signal, and outputs the delayed pulse signal. Here, the delay time with respect to the rising edge of the pulse signal is Tpd1, and the delay time with respect to the falling edge is Tpd1', where Tpd1 and Tpd1' are different from each other.

An XOR circuit 310 inverses and outputs the pulse signal. Here, the XOR circuit 310 also delays the pulse signal. Similarly to the case of the delay circuit 308, the delay time with respect to the rising edge of the pulse signal is Tpd2, and the delay time with respect to the falling edge is Tpd2', where Tpd2 and Tpd2' are different from each other.

A differentiating circuit 312 generates a pulse signal having a pulse width of P2 by using as a reference the falling edge of the pulse signal received from the XOR circuit 310. The integrating circuit 314 adjusts the pulse width of the pulse signal received from the differentiating circuit 312 to P2+P3, and outputs the adjusted pulse signal. It should be noted that the pulse width of P2+P3 is equal to the pulse width of the input pulse which is originally supplied to the pulse width adjusting section 302. The integrating circuit 314 supplies the pulse signal having the adjusted pulse width to the pulse width adjusting section 302, so that the pulse signal is looped. Here, the cycle T1 of this loop is represented by the following expression.

$$T1 = Tpd1 + Tpd2 + P2 + P3$$

The following explains the operation performed when the pulse generated by using as a reference the falling edge of the pulse signal is fed back. As shown in FIG. 2B, the XOR circuit 310 outputs the received pulse signal without inverting. The differentiating circuit 312 subsequently generates a pulse signal having a pulse width of P2 by using as a reference the falling edge of the pulse signal received from the XOR circuit 310. The integrating circuit 314 generates and loops a pulse signal having a pulse width of P2+P3. Here, the cycle T2 of this loop is represented by the following expression.

$$T2 = P1 + Tpd1' + Tpd2' + P2 + P3$$

The difference between the cycles T2 and T1 is represented as follows.

$$T2 - T1 = P1 + (Tpd1' - Tpd1) + (Tpd2' - Tpd2)$$

In the conventional pulse width adjusting circuit 300, this difference is treated as the pulse width of the pulse generated by the pulse width adjusting section 302. If Tpd1'=Tpd1 and Tpd2'=Tpd2 are satisfied, the difference precisely denotes the pulse width P1. However, the pulse width calculated in the above-described manner has a margin of error because the delay times, created by each of the delay circuit 308 and XOR circuit 310, with respect to the rising and falling edges are different from each other. This makes it difficult to measure an accurate pulse width of the pulse signal generated by the pulse width adjusting section 302. As a result, adjustment of the pulse width can not be accurate. In addition to this problem, the conventional pulse width adjusting circuit 300 also has a problem in relation to an offset delay time of the variable delay circuit 304.

FIG. 3 illustrates the configuration of the variable delay circuit 304. The variable delay circuit 304 includes a large delay circuit section 318 and a small delay circuit section 305. The small delay circuit section 305 generates a delay in smaller steps than the large delay circuit section 318. The large delay circuit section 318 and the small delay circuit section 305 are connected to each other in series. The variable delay circuit 304 delays the pulse signal by a time equal to the sum of the delay time achieved by the large delay circuit section 318 and the delay time achieved by the small delay circuit section 305.

The large delay circuit section 318 is configured, for example, in such a manner that a plurality of sequences each consisting of a plurality of inverters connected in series are connected in parallel. The delay time created by the large delay circuit section 318 is controlled by selecting the number of inverter sequences through which the pulse signal passes. On the other hand, the small delay circuit section 305 is configured in such a manner that a plurality of delay elements each constituted by two inverters and a variable capacity element are connected to each other in series. The delay time created by the small delay circuit section 305 is controlled by varying the capacity of each variable capacity element. The maximum delay time which can be achieved by the small delay circuit section 305 is equal to the delay resolution of the large delay circuit section 318. The variable delay circuit 304 having the above-described configuration provides a highly variable delay time, a high delay resolution and a small delay-setting step.

In the small delay circuit section 305, the pulse signal passes through the inverters connected in series. Therefore, a predetermined amount of offset delay unavoidably occurs even when the delay time is set shortest. Such offset delay can be reduced by using a smaller number of combinations of the inverters and variable capacity element. However, to keep the delay time created by the small delay circuit section 305 within the range of the delay resolution of the large delay circuit section 318, the small delay circuit section 305 needs around five or six combinations of the inverters and variable capacity element. Accordingly, it is difficult to reduce the offset delay of the small delay circuit section 305. For the reasons stated above, the conventional pulse width adjusting circuit 300 has difficulties in simultaneously realizing generation of a pulse signal having a small pulse width and adjustment of a pulse width with high resolution.

[Patent Document 1] Unexamined Japanese Patent Application Publication No. 1998-303709

As explained above, a conventional pulse width adjusting circuit has difficulties in simultaneously realizing generation of a pulse signal having a small pulse width and adjustment of a pulse width with high resolution. Also, the conventional pulse width adjusting circuit can not measure an accurate pulse width of the pulse signal generated, which makes it difficult to adjust the pulse width accurately.

SUMMARY OF THE INVENTION

In light of the above problems, the object of the present invention is to provide a pulse width adjusting circuit and a pulse width adjusting method, and a semiconductor test apparatus using such a circuit. This object is achieved by combining the features recited in the independent claims. The dependent claims define further effective specific example of the present invention.

To solve the above problems, a first embodiment of the present invention provides a pulse width adjusting circuit for generating an output signal by adjusting a pulse width of an input pulse signal and outputting the output signal. Here, the pulse width adjusting circuit includes a first delay circuit to output a first delay signal generated by delaying the pulse signal by a certain delay time, a second delay circuit to output a second delay signal generated by delaying the pulse signal by a different delay time from the first delay circuit, and an output section to generate and output the output signal in accordance with the first and second delay signals. Here, the output signal has a pulse width corresponding to a difference between the delay times respectively achieved by the first and second delay circuits.

The first and second delay circuits may have different delay resolutions to delay the pulse signal. The output section may select two edges of a same transiting direction respectively from the first and second delay signals, and generates a rising edge and a falling edge of the output signal in accordance with the selected two edges.

The output section may include a set-reset latch circuit to output an H-logic in accordance with the first delay signal and output an L-logic in accordance with the second delay signal, and the pulse width adjusting circuit may further include a pre-pulse generator to receive the first and second delay signals, adjust pulse widths of the first and second delay signals so as to be substantially equal to each other and so that the first and second delay signals do not cause the set-reset latch circuit to operate simultaneously, and supply the first and second delay signals having the adjusted pulse widths to the set-reset latch circuit.

The pulse width adjusting circuit may further include a measuring section to measure the pulse width of the output signal. The output section may further pass the first and second delay signals output from the pre-pulse generator therethrough. The measuring section may include a loop unit to receive one of the first and second delay signals that is passed through the output section, adjust a pulse width of the received delay signal so as to be substantially equal to the pulse width of the pulse signal, and input the delay signal with the adjusted pulse width into the first and second delay circuits as the pulse signal, a cycle measuring section to measure a first loop cycle of a loop formed when the loop unit loops the first delay signal, and a second loop cycle of a loop formed when the loop unit loops the second delay signal, and a calculating section to calculate the pulse width of the output signal based on a difference between the first and second loop cycles.

The pre-pulse generator may include a first pulse generator to adjust the pulse width of the first delay signal, a second pulse generator to adjust the pulse width of the second delay signal, a first control unit to control the first pulse generator so as to output one of the first delay signal the pulse width of which has been adjusted, the first delay signal the pulse width of which has not been adjusted, and a signal to cause the set-reset latch circuit to pass the second delay signal therethrough, and a second control unit to control the second pulse generator so as to output one of the second delay signal the pulse width of which has been adjusted, the second delay signal the pulse width of which has not been adjusted, and a signal to cause the set-reset latch circuit to pass the first delay signal therethrough.

The pulse width adjusting circuit may operate in one of a main operation mode to generate the output signal to be output to an external device, a former edge measuring operation mode to measure the first loop cycle, and a latter edge measuring operation mode to measure the second loop cycle. When the pulse width adjusting circuit operates in the main operation mode, the first control unit may control the first pulse generator to output the first delay signal the pulse width of which has been adjusted, and the second control unit may control the second pulse generator to output the second delay signal the pulse width of which has been adjusted. When the pulse width adjusting circuit operates in the former edge measuring operation mode, the first control unit may control the first pulse generator to output the first delay signal the pulse width of which has not been adjusted, and the second control unit may control the second pulse generator to output the signal to cause the set-reset latch circuit to pass the first delay signal therethrough. When the pulse width adjusting circuit operates in the latter edge measuring operation mode, the first control unit may control the first pulse generator to output the signal to cause the set-reset latch circuit to pass the second delay signal therethrough, and the second control unit may control the second pulse generator to output the second delay signal the pulse width of which has not been adjusted.

The set-reset latch circuit may include a delay unit, on a path to pass the second delay signal therethrough when the latter edge measuring operation mode is selected, to reduce a skew created between a path to generate the falling edge of the output signal in accordance with the second delay signal when the main operation mode is selected and the path to pass the second delay signal therethrough when the latter edge measuring operation mode is selected.

The first pulse generator may include a first AND circuit to receive the first delay signal and output an inverse signal of a logical AND between the received first delay signal and a first control signal received from the first control unit, a second AND circuit to receive an inverse signal of the first delay signal, and output an inverse signal of a logical AND between the received inverse signal of the first delay signal and a second control signal received from the first control unit, a third delay circuit to delay the signal output from the second AND circuit, and a third AND circuit to output an inverse signal of a logical AND between the signal output from the first AND circuit and the signal output from the third delay circuit. The first control unit may output an H-logic as the first and second control signals when the pulse width adjusting circuit operates in the main operation mode. The first control unit may output an H-logic as one of the first and second control signals, and output an L-logic as the other control signal when the pulse width adjusting circuit operates in the latter edge measuring operation mode. The first control unit may output an H-logic as the first control signal, and output an L-logic as the second control signal when the pulse width adjusting circuit operates in the former edge measuring operation mode.

The second pulse generator may include a fourth AND circuit to receive the second delay signal and output an inverse signal of a logical AND between the received second delay signal and a third control signal received from the second control unit, a fifth AND circuit to receive an inverse signal of the second delay signal, and output an inverse signal of a logical AND between the received inverse signal of the second delay signal and a fourth control signal received from the second control unit, a fourth delay circuit to delay the signal output from the fifth AND circuit, and a sixth AND circuit to output an inverse signal of a logical AND between the signal output from the fourth AND circuit and the signal output from the fourth delay circuit. The second control unit may output an H-logic as the third and fourth control signals when the pulse width adjusting circuit operates in the main operation mode. The second control unit may output an L-logic as the first and second control signals when the pulse width adjusting circuit operates in the latter edge measuring operation mode. The second control unit may output an H-logic as one of the first and second control signals, and output an L-logic as the other control signal when the pulse width adjusting circuit operates in the former edge measuring operation mode.

A second embodiment of the present invention provides a pulse width adjusting method for generating an output signal by adjusting a pulse width of an input pulse signal and outputting the output signal. The pulse width adjusting method includes generating a first delay signal by delaying the pulse signal by a certain delay time, generating a second delay signal by delaying the pulse signal by a different delay time from the step of generating the first delay signal, and generating and outputting the output signal in accordance with the first and second delay signals. Here, the output signal has a pulse width corresponding to a difference between the delay times respectively achieved in the steps of generating the first and second delay signals.

The pulse width adjusting method may further include measuring the delay time achieved in the step of generating the first delay signal, measuring the delay time achieved in the step of generating the second delay signal, and adjusting the delay times achieved in the steps of generating the first and second delay signals, based on the delay times measured in the steps of measuring the delay times achieved in the steps of generating the first and second delay signals. Here, the step of generating and outputting the output signal to an external device is performed after the step of adjusting the delay times.

A third embodiment of the present invention provides a semiconductor test apparatus to test a semiconductor circuit including a pattern generator to generate a test pattern for testing the semiconductor circuit, a waveform shaper to shape a test signal to be supplied to the semiconductor circuit, based on the test pattern, a timing signal generating circuit to supply a timing signal to determine a phase of the test signal, to the waveform shaper, and a judging section to judge whether the semiconductor circuit is good or bad based on an output signal output from the semiconductor circuit. Here, the timing signal generating circuit is a pulse width adjusting circuit for generating the timing signal by adjusting a pulse width of an input pulse signal and outputting the timing signal. The pulse width adjusting circuit includes a first delay circuit to output a first delay signal generated by delaying the pulse signal by a certain delay time, a second delay circuit to output a second delay signal generated by delaying the pulse signal by a different delay time from the first delay circuit, and an output section to, in accordance with the first and second delay signals, generate and output the timing signal having a pulse width corresponding to a difference between the delay times respectively achieved by the first and second delay circuits.

Here, all the necessary features of the present invention are not listed in the summary of the invention. The sub-combinations of the features may also constitute the invention.

The present invention can generate an output signal having a pulse width adjusted with high resolution. Also, the pulse width is smaller than the offset delay time of the delay circuit. In addition, the present invention can accurately measure the pulse width of the output signal.

BRIEF DESCRIPTION OF THE DRAWINGS

FIG. 2 illustrates an operation performed when a pulse width is measured in the conventional pulse width adjusting circuit 300, where

FIG. 7 is used to describe operations performed by a first pulse generator 26 when the pulse width adjusting circuit 100 operates in different operation modes, where FIG. 7A illustrates an operation of the first pulse generator 26 when the pulse width adjusting circuit 100 is in the main operation mode, FIG. 7B illustrates an operation of the first pulse generator 26 when the pulse width adjusting circuit 100 is in a former edge measuring operation mode, and FIG. 7C illustrates an operation of the first pulse generator 26 when the pulse width adjusting circuit 100 is in a latter edge measuring operation mode.

DETAILED DESCRIPTION OF THE INVENTION

Hereinafter, the present invention will now be described through preferred embodiments. The embodiments do not limit the invention according to claims and all the combinations of the features described in the embodiments are not necessarily essential to means for solving the problems of the invention.

Figure 1:
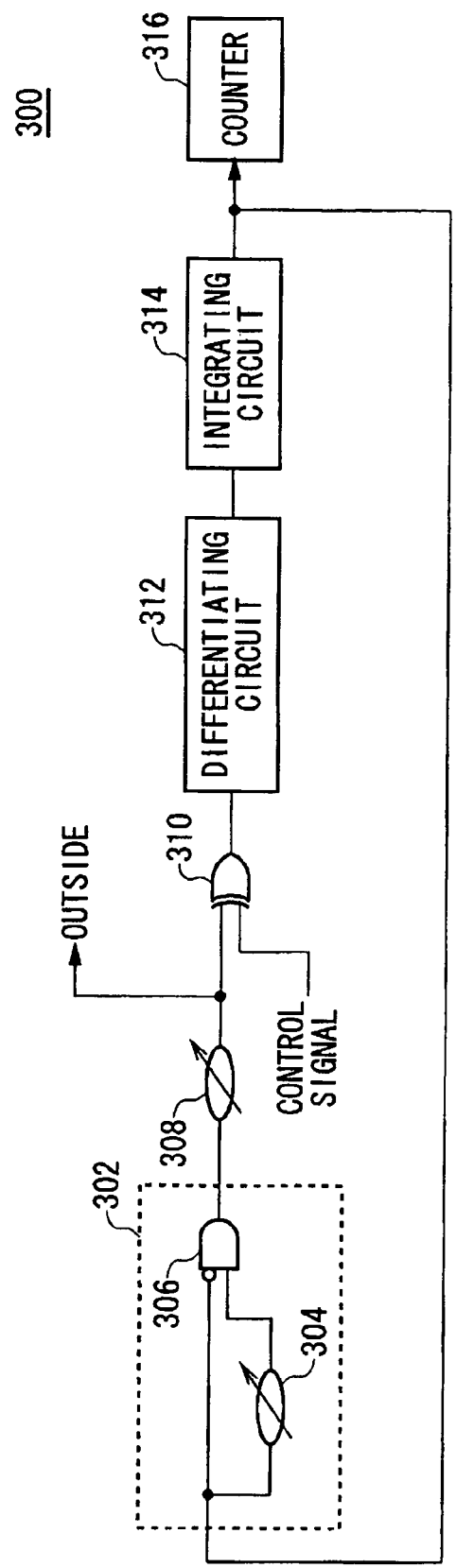
FIG. 1 illustrates a conventional pulse width adjusting circuit 300.
Figure 2A:
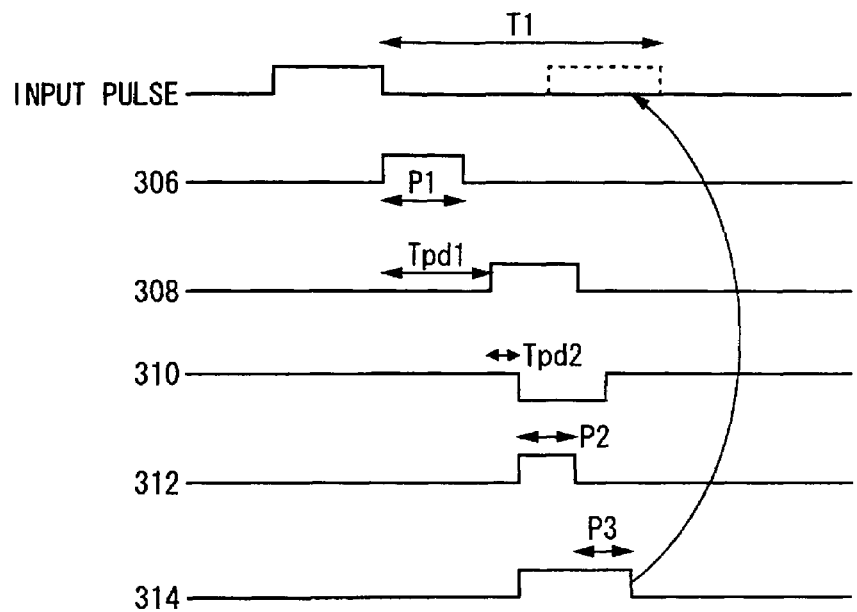
FIG. 2A illustrates an operation performed when a pulse generated by using as a reference the rising edge of a pulse signal is fed back.
Figure 2B:
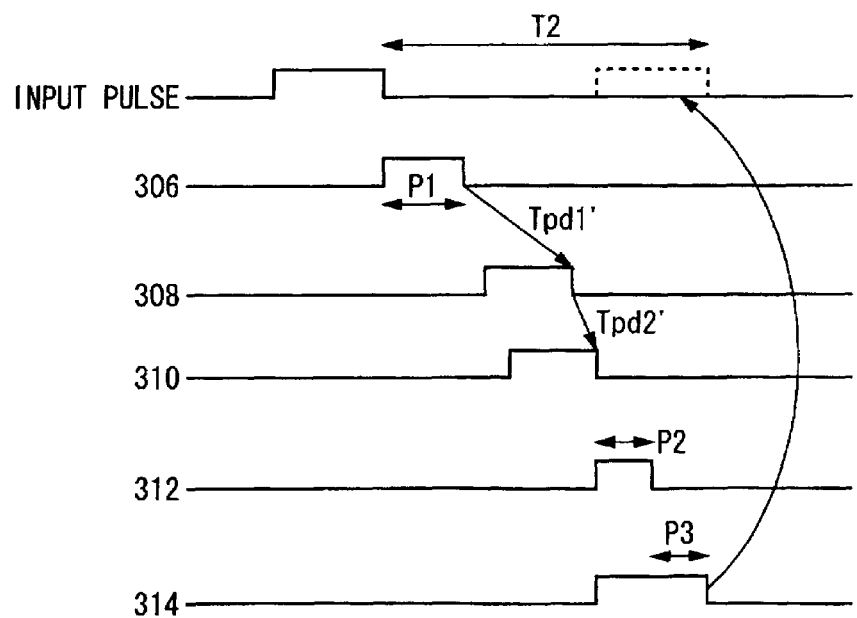
FIG. 2B illustrates an operation performed when a pulse generated by using as a reference the falling edge of a pulse signal is fed back.
Figure 3:
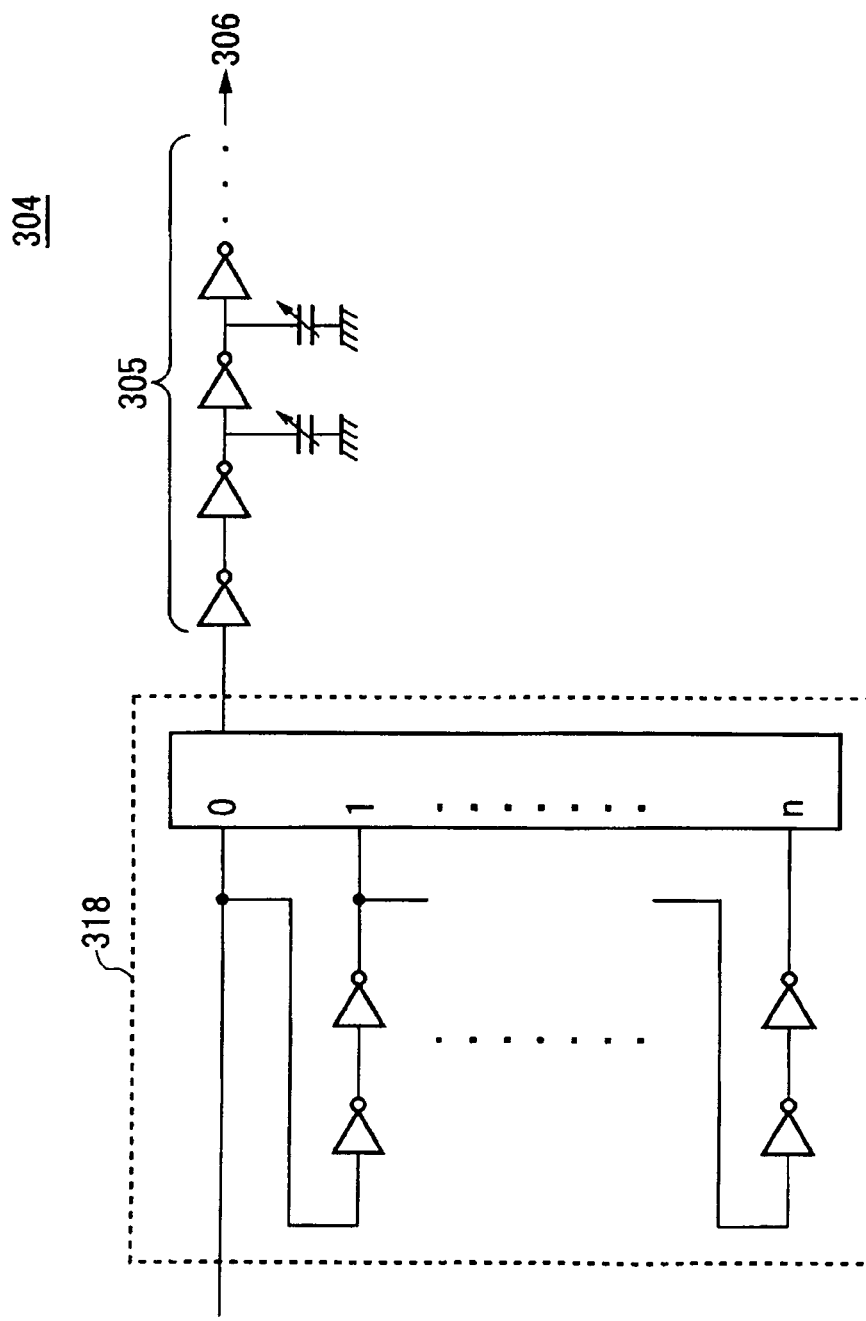
FIG. 3 illustrates the configuration of a conventional variable delay circuit 304.
Figure 4:
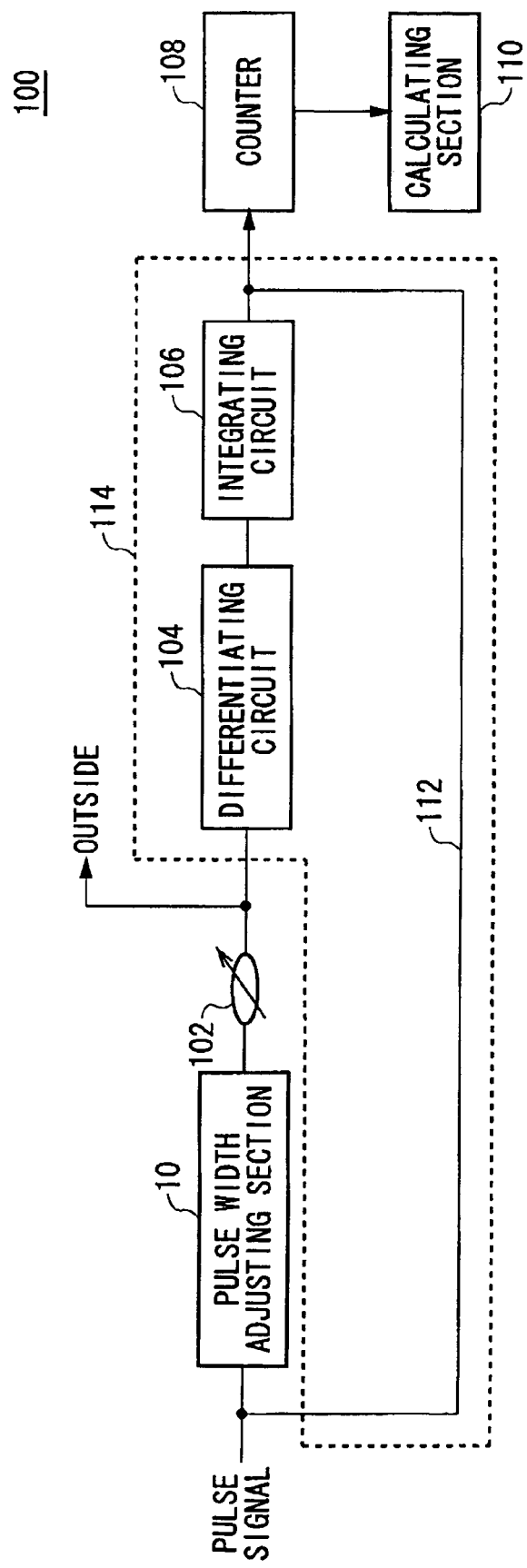
FIG. 4 illustrates an example of the configuration of a pulse width adjusting circuit 100 relating to an embodiment of the present invention.

FIG. 4 illustrates an example of the configuration of a pulse width adjusting circuit 100 relating to an embodiment of the present invention. The pulse width adjusting circuit 100 outputs an output signal generated by adjusting the pulse width of an input pulse signal. Here, the pulse width adjusting circuit 100 operates in three different modes: a main operation mode to generate the output signal to be output to an external device, and a former edge measuring operation mode and a latter edge measuring operation mode to measure the pulse width of the output signal. In the former edge measuring operation mode, the pulse width adjusting circuit 100 operates, for example, in the same manner as illustrated in FIG. 2A. In the latter edge measuring operation mode, the pulse width adjusting circuit 100 operates, for example, in the same manner as illustrated in FIG. 2B. The pulse width adjusting circuit 100 includes a pulse width adjusting section 10, a variable delay circuit 102, a loop unit 114, a counter 108 and a calculating section 110.

The pulse width adjusting section 10 is supplied with a pulse signal, generates an output signal by adjusting the pulse width of the supplied pulse signal, and outputs the output signal. The variable delay circuit 102 receives the output signal generated by the pulse width adjusting section 10 by adjusting the pulse width of the pulse signal, delays the received signal by a desired time, and outputs the delayed signal.

The loop unit 114, counter 108 and calculating section 110 together function as a measuring section to measure the pulse width of the output signal output from the pulse width adjusting section 10. When the pulse width adjusting circuit 100 is in the former edge measuring operation mode and latter edge measuring operation mode, the loop unit 114 adjusts the pulse width of the output signal so as to be substantially equal to the pulse width of the pulse signal originally supplied to the pulse width adjusting section 10, and inputs the adjusted output signal to the pulse width adjusting section 10 as a pulse signal.

According to the present embodiment, the loop unit 114 includes a differentiating circuit 104, an integrating circuit 106 and a loop path 112.

The differentiating circuit 104 adjusts the output signal by reducing the pulse width to a predetermined pulse width, and outputs the adjusted output signal. The differentiating circuit 104 and integrating circuit 106 each may have substantially the same configuration as the pulse width adjusting section 10. The integrating circuit 106 adjusts the output signal, the pulse width of which has been adjusted by the differentiating circuit 104, by increasing the pulse width so as to be substantially equal to the pulse width of the pulse signal. Here, the loop path 112 electrically connects the integrating circuit 106 and the pulse width adjusting section 10 to each other, so that the output signal the pulse width of which has been adjusted by the integrated circuit 106 is input into the pulse width adjusting section 10 as a pulse signal. Thus, a loop is formed.

The counter 108 counts the pulses while the loop is maintained. The calculating section 110 has a function as a cycle measuring section to measure the cycle of the loop based on the counting result obtained by the counter 108. In addition, the calculating section 110 calculates the pulse width of the output signal output from the pulse width adjusting section 10, based on the measured cycle. The calculation of the pulse width is explained later with reference to FIG. 7.

Figure 5:
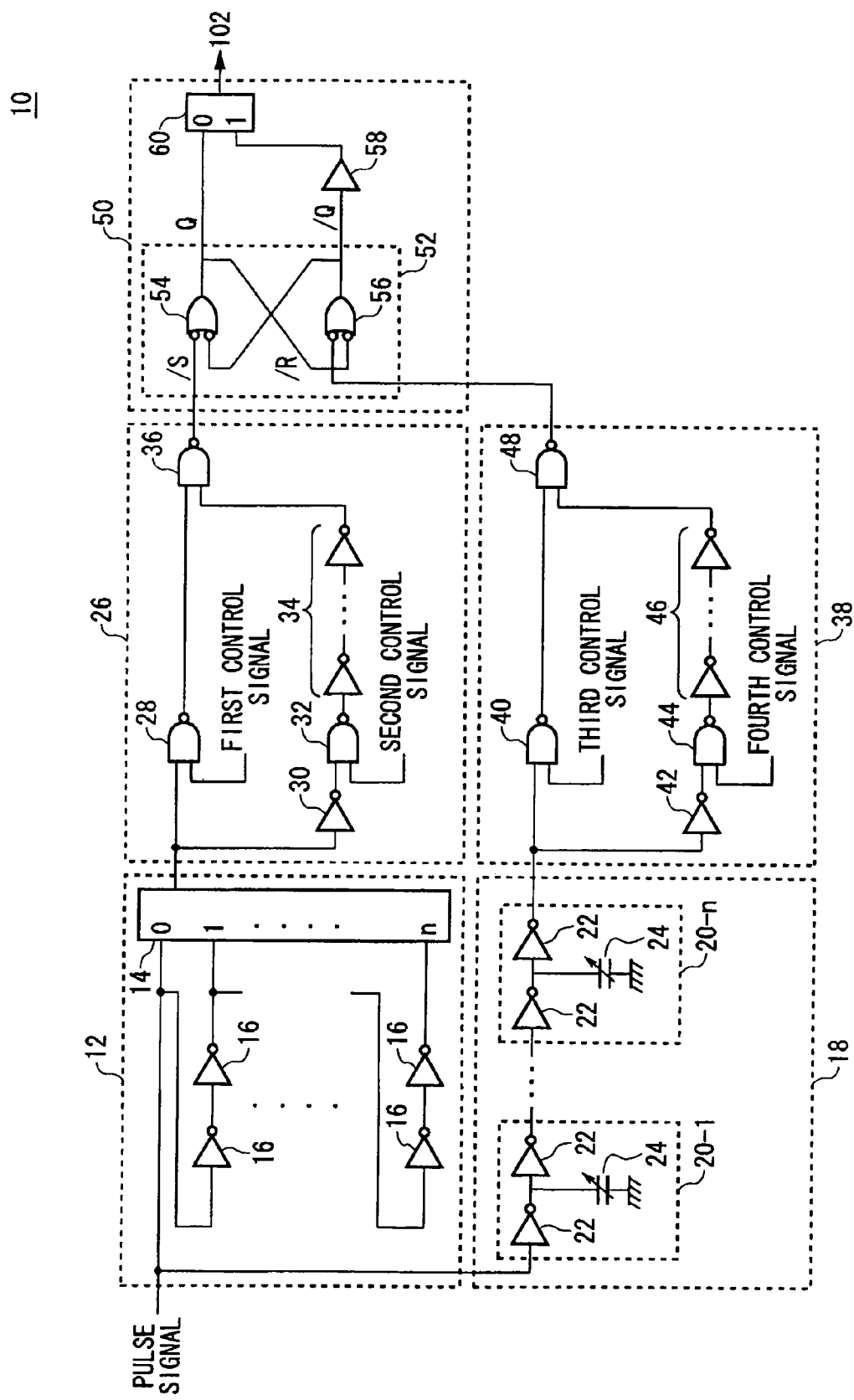
FIG. 5 illustrates an example of the configuration of a pulse width adjusting section 10.

FIG. 5 illustrates an example of the configuration of the pulse width adjusting section 10. The pulse width adjusting section 10 includes a first delay circuit 12, a second delay circuit 18, a first pulse generator 26, a second pulse generator 38 and an output section 50.

The first delay circuit 12 receives the pulse signal, delays the received pulse signal and outputs the delayed pulse signal as a first delay signal. According to the present embodiment, the first delay circuit 12 includes a plurality of inverter sequences each of which includes two inverters 16 connected to each other in series, and a selecting section 14. The inverter sequences are connected to each other in series. Here, the pulse signal is input into the initial inverter sequence. The selecting section 14 selects one of the signals respectively output from the inverter sequences, and outputs the selected signal as the first delay signal. The signal selection performed by the selecting section 14 can control the delay time created by the first delay circuit 12.

The second delay circuit 18 delays the pulse signal by a different delay time from the first delay circuit 12, and outputs the delayed pulse signal as a second delay signal. According to the present embodiment, the delay time of the second delay circuit 18 is longer than that of the first delay circuit 12. In addition, the first and second delay circuits 12 and 18 preferably have different delay resolutions to delay the pulse signal. Here, according to the present embodiment, the second delay circuit 18 delays the pulse signal with higher delay resolution, in other words, in smaller steps, than the first delay circuit 12. Furthermore, it is preferable that the variable range of the delay time achieved by the second delay circuit 18 is set substantially equal to the delay resolution of the first delay circuit 12. According to the present embodiment, the second delay circuit 18 includes a plurality of delay elements (20-1 to 20-$n$ and $n$ is an integer of two or more, hereinafter collectively represented by a reference numeral 20) connected to each other in series. Each of the plurality of delay elements 20 includes two inverters 22 connected to each other in series and a variable capacity element 24 disposed between the ground potential and the path of connecting the two inverters 22. The delay time created by each delay element 20 is controlled by changing the capacity of the variable capacity element 24.

The first and second delay circuits 12 and 18 perform the above-described operations irrespective of which operation mode the pulse width adjusting circuit 100 is in. The following explains the operations performed by the first pulse generator 26, the second pulse generator 38 and the output section 50 when the pulse width adjusting circuit 100 operates in the main operation mode.

The output section 50 outputs the output signal which has a pulse width corresponding to the difference in delay time between the first and second delay circuits 12 and 18, based on the first and second delay signals. To be specific, the output section 50 selects the edges of the same transiting direction from the edges of the first and second delay signals, and generates the rising and falling edges of the output signal in accordance with the selected two edges. For example, the output section 50 generates the rising edge of the output signal in synchronization with the falling edge of the first delay signal, and generates the falling edge of the output signal in synchronization with the falling edge of the second delay signal.

According to the present embodiment, the output section 50 includes a set-reset latch circuit 52 that outputs an H-logic in accordance with the first delay signal, and outputs an L-logic in accordance with the second delay signal. To be specific, the set-reset latch circuit 52 outputs the H-logic through a positive output terminal Q in synchronization with the falling edge of the first delay signal, and outputs the L-logic through the positive output terminal Q in synchronization with the falling edge of the second delay signal. In addition, the set-reset latch circuit 52 outputs, through a negative output terminal /Q, inverse signals with respect to the signals output through the positive output terminal Q. Having the described configuration, the output section 50 can output the output signal having the pulse width corresponding to the difference in delay time between the first and second delay circuits 12 and 18.

The first and second pulse generators 26 and 38 respectively receive the first and second delay signals. The first and second pulse generators 26 and 38 together operate as a pre-pulse generator. The pre-pulse generator adjusts the pulse widths of the first and second delay signals such that the first and second delay signals do not cause the set-reset latch circuit 52 to operate at the same time, and supplies the adjusted first and second delay signals to the set-reset latch circuit 52. The first pulse generator 26 adjusts the pulse width of the first delay signal, and supplies the adjusted first delay signal to a set terminal /S of the set-reset latch circuit 52, and the second pulse generator 38 adjusts the pulse width of the second delay signal, and supplies the adjusted second delay signal to a reset terminal /R of the set-reset latch circuit 52. Since the set-reset latch circuit 52 relating to the present embodiment operates with negative logic, the first and second pulse generators 26 and 38 invert the first and second delay signals having the adjusted pulse widths, and supply the inverted first and second delay signals to the set-reset latch circuit 52. The configurations of the first and second pulse generators 26 and 38 are described later with reference to FIG. 7.

The output section 50 also has a function of passing the first and second delay signals output from the pre-pulse generator therethrough. When the pulse width adjusting circuit 100 operates in the former edge measuring operation mode, the output section 50 passes the first delay signal therethrough. On the other hand, when the pulse width adjusting circuit 100 operates in the latter edge measuring operation mode, the output section 50 passes the second delay signal therethrough. Here, the loop unit 114 (see FIG. 4) receives one of the first and second delay signals which is passed through the output section 50, adjusts the pulse width of the received delay signal so as to be substantially equal to the pulse width of the pulse signal, and inputs the adjusted delay signal into the first and second delay circuits as a pulse signal.

The counter 108 (see FIG. 4) counts the pulses while the loop of the first delay signal formed by the loop unit 114 is maintained. Based on the counting result obtained by the counter 108, the calculating section 110 (see FIG. 4) obtains a first loop cycle of the loop of the first delay signal formed by the loop unit 114. In a similar fashion, the calculating section 110 obtains a second loop cycle of the loop of the second delay signal formed by the loop unit 114. Following this, the calculating section 110 calculates the difference between the first loop cycle and the second loop cycle, to obtain the pulse width of the output signal. Having the described configuration, the pulse width adjusting circuit 100 can measure the pulse width of the output signal generated by the pulse width adjusting section 10.

Figure 6:
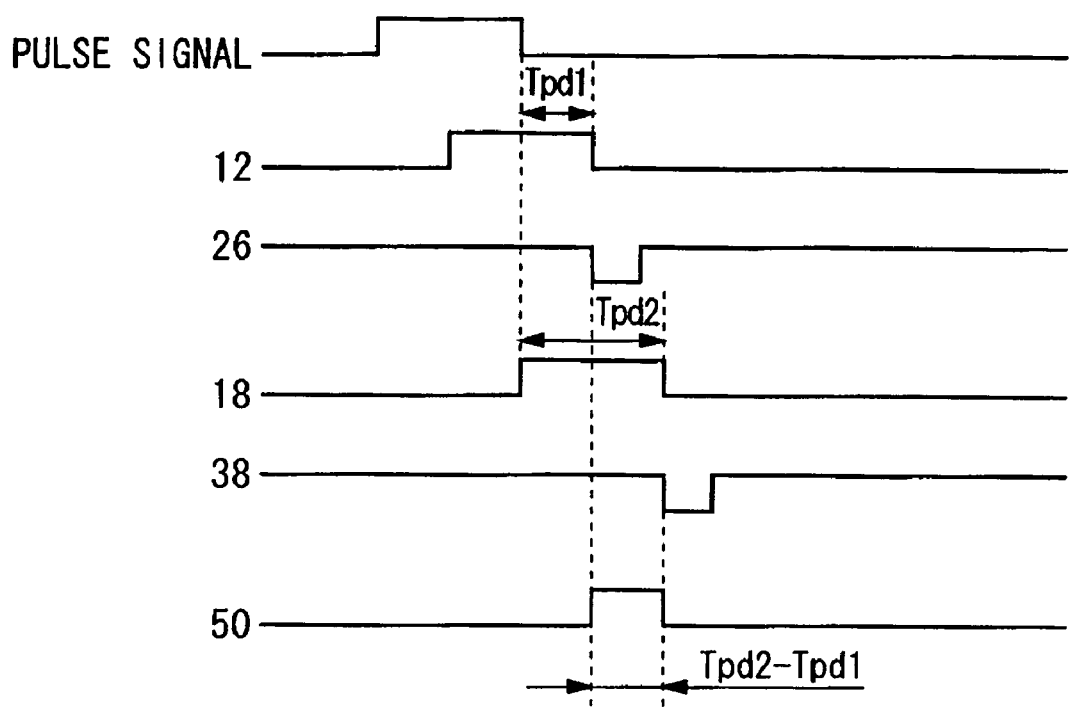
FIG. 6 is used to describe an operation performed by the pulse width adjusting section 10 when the pulse width adjusting circuit 100 operates in a main operation mode.

FIG. 6 illustrates an operation performed by the pulse width adjusting section 10 when the pulse width adjusting circuit 100 is in the main operation mode. To start with, the pulse signal shown in FIG. 6 is input into the first and second delay circuits 12 and 18. The first delay circuit 12 delays the pulse signal by a delay time Tpd1, and outputs the delayed signal as the first delay signal. The second delay circuit 18 delays the pulse signal by a delay time Tpd2, and outputs the delayed signal as the second delay signal.

Following this, the first pulse generator 26 adjusts the pulse width of the first delay signal, and outputs an inverse signal of the adjusted first delay signal in synchronization with the falling edge of the first delay signal. The second pulse generator 38 adjusts the pulse width of the second delay signal, and outputs an inverse signal of the adjusted second delay signal in synchronization with the falling edge of the second delay signal.

Subsequently, the output section 50 outputs the output signal which is set to the H-logic in synchronization with the falling edge of the signal output from the first pulse generator 26 and is set to the L-logic in synchronization with the falling edge of the signal output from the second pulse generator 38. Operating in this manner, the output section 50 generates the output signal which has the pulse width corresponding to the difference in delay time between the first and second delay circuits 12 and 18. According to the present embodiment, the pulse width adjusting section 10 generates the rising edge of the output signal in accordance with the first delay signal, and generates the falling edge of the output signal in accordance with the second delay signal. In this way, the pulse width adjusting section 10 can control the pulse width with the delay resolution of the second delay circuit 18, which has a higher resolution. At the same time, the output signal generated by the pulse width adjusting section 10 has a pulse width smaller than the offset delay time of the second delay circuit 18. Furthermore, the rising and falling edges of the output signal are generated by using as a reference the edges of the same transiting direction which are selected from the edges of the first and second delay signals. As a consequence, the pulse width adjusting section 10 can reduce the error caused by the difference between the delay times with respect to the rising and falling edges of the pulse signal, and accurately adjust the pulse width of the output signal.

FIG. 7 illustrates the operations performed by the first pulse generator 26 when the pulse width adjusting circuit 100 operates in the respective operation modes. FIG. 7A illustrates the operation of the first pulse generator 26 in the case of the main operation mode, FIG. 7B illustrates the operation of the first pulse generator 26 in the case of the former edge measuring operation mode, and FIG. 7C illustrates the operation of the first pulse generator 26 in the case of the latter edge measuring operation mode.

The configuration of the pre-pulse generator is described with reference to FIG. 5. As mentioned above, the pre-pulse generator is constituted by the first and second pulse generators 26 and 38. The first pulse generator 26 includes a first AND circuit 28, a second AND circuit 32, a third AND circuit 36, a third delay circuit 34 and an inverter 30. The first AND circuit 28 receives the first delay signal, and outputs an inverse signal of a logical AND between the received first delay signal and a first control signal received from a first control unit (not shown).

The inverter 30 receives the first delay signal, and outputs an inverse signal of the first delay signal. The second AND circuit 32 receives the inverse signal of the first delay signal, and outputs an inverse signal of a logical AND between the received inverse signal of the first delay signal and a second control signal received from the first control unit. The third delay circuit 34 delays the signal output from the second AND circuit 32, and outputs the delayed signal. The third AND circuit 36 outputs an inverse signal of a logical AND between the signal output from the first AND circuit 28 and the signal output from the third delay circuit 34.

Depending on the operation modes of the pulse width adjusting circuit 100, the first control unit supplies the first and second control signals of different types. According to the present embodiment, the first control unit controls the first pulse generator 26 to output one of the first delay signal the pulse width of which has been adjusted, the first delay signal the pulse width of which has not been changed, and the signal to cause the set-reset latch circuit 52 to pass the second delay signal therethrough.

The second pulse generator 38 includes a fourth AND circuit 40, a fifth AND circuit 44, a sixth AND circuit 48, a fourth delay circuit 46 and an inverter 42. The fourth AND circuit 40 receives the second delay signal, and outputs an inverse signal of a logical AND between the received second delay signal and a third control signal received from a second control unit (not shown).

The inverter 42 receives the second delay signal, and outputs an inverse signal of the second delay signal. The fifth AND circuit 44 receives the inverse signal of the second delay signal, and outputs an inverse signal of a logical AND between the received inverse signal of the second delay signal and a fourth control signal received from the second control unit. The fourth delay circuit 46 delays the signal output from the fifth AND circuit 44, and outputs the delayed signal. The sixth AND circuit 48 outputs an inverse signal of a logical AND between the signal output from the fourth AND circuit 40 and the signal output from the fourth delay circuit 46.

Depending on the operation modes of the pulse width adjusting circuit 100, the second control unit supplies the third and fourth control signals of different types. According to the present embodiment, the second control unit controls the second pulse generator 38 to output one of the second delay signal the pulse width of which has been adjusted, the second delay signal the pulse width of which has not been changed, and the signal to cause the set-reset latch circuit 52 to pass the first delay signal therethrough. The first and second control units may be terminals to receive the control signals from an external source and supply the received control signals to the first and second pulse generators 26 and 38.

Referring to FIG. 7A, when the pulse width adjusting circuit 100 operates in the main operation mode, the first control unit controls the first pulse generator 26 to output the first delay signal the pulse width of which has been adjusted. In other words, the first control unit outputs the H-logic as the first and second control signals. Here, the third AND circuit 36 of the first pulse generator 26 adjusts the pulse width of the first delay signal in accordance with the delay time of the third delay circuit 34, and outputs the adjusted first delay signal as shown in FIG. 7A.

When the pulse width adjusting circuit 100 operates in the main operation mode, the second control unit causes the second pulse generator 38 to output the second delay signal the pulse width of which has been adjusted. In other words, the second control unit outputs the H-logic as the third and fourth control signals. Here, the second pulse generator 38 operates in the same manner as the first pulse generator 26 as shown in FIG. 7A. Specifically speaking, the second pulse generator 38 adjusts the pulse width of the second delay signal in accordance with the delay time of the fourth delay circuit 46, and outputs the adjusted second delay signal.

When the pulse width adjusting circuit 100 operates in the main operation mode, the set-reset latch circuit 52 receives the first and second delay signals having the adjusted pulse widths, from the first and second pulse generators 26 and 38, and outputs the output signal through the positive output terminal Q. Here, the output section 50 further includes a selecting section 60 to select and output one of the signal output through the positive output terminal Q of the set-reset latch circuit 52 and the signal output through the negative output terminal /Q. When the pulse width adjusting circuit 100 is in the main operation mode, the selecting section 60 selects the signal output through the positive output terminal Q, and outputs the selected signal to the variable delay circuit 102. Operating in the above-described fashion, the pulse width adjusting circuit 100 outputs the output signal having an adjusted pulse width to an external device.

Referring to FIG. 7B, when the pulse width adjusting circuit 100 operates in the former edge measuring operation mode, the first control unit controls the first pulse generator 26 to output the first delay signal without changing the pulse width. This can be accomplished in such a manner that the first control unit outputs the H-logic as one of the first and second control signals and outputs the L-logic as the other control signal. For example, the first control unit outputs the H-logic as the first control signal, and outputs the L-logic as the second control signal. In this way, the output from the third delay circuit 34 is fixed to the H-logic, and the third AND circuit 36 passes the first delay signal therethrough as shown in FIG. 7B.

When the pulse width adjusting circuit 100 operates in the former edge measuring operation mode, the second control unit controls the second pulse generator 38 to output the signal to cause the set-reset latch circuit 52 to pass the first delay signal therethrough. More specifically, the second control unit outputs the L-logic as the third and fourth control signals. In this case, the operation performed by the second pulse generator 38 is the same as the operation performed by the first pulse generator 26 which is later explained with reference to FIG. 7C. Which is to say, the second pulse generator 38 supplies an L-logic-fixed signal to the reset terminal /R of the set-reset latch circuit 52.

When the pulse width adjusting circuit 100 operates in the former edge measuring operation mode, the set-reset latch circuit 52 is supplied at the set terminal /S with the first delay signal the pulse width of which has not been changed, and at the reset terminal /R with the L-logic-fixed signal. Consequently, the set-reset latch circuit 52 outputs through the positive output terminal Q a signal generated by inverting the first delay signal once, and the output through the negative output terminal /Q is fixed to the H-logic. The selecting section 60 subsequently selects and outputs the signal received from the positive output terminal Q of the set-reset latch circuit 52. The loop unit 114 then forms a loop of the first delay signal output from the selecting section 60. The calculating section 110 calculates the first loop cycle of the loop of the first delay signal.

Referring to FIG. 7C, when the pulse width adjusting circuit 100 operates in the latter edge measuring operation mode, the first control unit controls the first pulse generator 26 to output the signal to cause the set-reset latch circuit 52 to pass the second delay signal therethrough. According to the present embodiment, the set-reset latch circuit 52 operates with the negative logic. Therefore, the first control unit fixes the output from the first pulse generator 26 to the L-logic. In other words, the first control unit outputs the L-logic as the first and second control signals. In this case, the outputs from the first AND circuit 28 and the third delay circuit 34 are fixed to the H-logic, and the output from the third AND circuit 36 is fixed to the L-logic, as shown in FIG. 7C.

When the pulse width adjusting circuit 100 operates in the latter edge measuring operation mode, the second control unit controls the second pulse generator 38 to output the second delay signal the pulse width of which has not been changed. This can be accomplished in such a manner that the second control unit outputs the H-logic as one of the third and fourth control signals and outputs the L-logic as the other control signal. For example, the second control unit outputs the H-logic as the third control signal, and outputs the L-logic as the fourth control signal. In this case, the operation performed by the second pulse generator 38 is the same as the operation performed by the first pulse generator 26 which is shown in FIG. 7B. The output from the fourth delay circuit 46 is fixed to the H-logic, and the sixth AND circuit 48 passes the second delay signal therethrough.

When the pulse width adjusting circuit 100 operates in the latter edge measuring operation mode, the set-reset latch circuit 52 is supplied at the reset terminal /R with the second delay signal the pulse width of which has not been changed, and at the set terminal /R with an L-logic-fixed signal. Consequently, the output from the positive output terminal Q of the set-reset latch circuit 52 is fixed to the H-logic, and the set-reset latch circuit 52 outputs through the negative output terminal /Q a signal generated by inverting the second delay signal once. The selecting section 60 subsequently selects and outputs the signal received from the negative output terminal /Q of the set-reset latch circuit 52. The loop unit 114 then forms a loop of the second delay signal output from the selecting section 60. The calculating section 110 calculates the second loop cycle of the loop of the second delay signal.

By calculating the difference between the second loop cycle and the first loop cycle, the calculating section 110 obtains the pulse width of the output signal output from the pulse width adjusting section 10 when the pulse width adjusting circuit 100 operates in the main operation mode. This is because the difference between the second and first loop cycles is equal to the difference between the second delay time achieved by the second delay circuit 18 and the first delay time achieved by the first delay circuit 12, and this difference in delay time is equal to the pulse width of the output signal output when the pulse width adjusting circuit 100 operates in the main operation mode. Accordingly, the calculating section 110 can measure the pulse width of the output signal of the output signal output when the pulse width adjusting circuit 100 is in the main operation mode.

The pulse width adjusting section 10 preferably further includes a unit for adjusting the delay times achieved by the first and second delay circuits 12 and 18 to ensure that the pulse width of the output signal is substantially equal to a desired width. Furthermore, the delay times created by the first and second delay circuits 12 and 18 may be respectively adjusted so as to be substantially equal to predetermined delay times. Because of this configuration, the output signal generated by the pulse width adjusting section 10 can have an accurately controlled desired pulse width.

According to the present embodiment, the signals respectively generated by inverting the first and second delay signals once are looped, and the cycles of the loops are measured in order to obtain the pulse width of the output signal. Because of this configuration, the delay times of the respective delay signals are the same on the loop path including the variable delay circuit 102. This means that the error created by the difference in delay times with respect to the rising and falling edges of the signal is not observed on the variable delay circuit 102 and the like. As a result, the pulse width of the output signal output when the pulse width adjusting circuit 100 operates in the main operation mode can be accurately measured, which enables the output signal having an accurately adjusted pulse width to be generated.

The output section 50 preferably further includes a buffer 58 between the negative output terminal /Q of the set-reset latch circuit 52 and the selecting section 60 for the following reason. The path to generate the falling edge of the output signal in accordance with the second delay signal in the case of the main operation mode is different from the path to pass the second delay signal in the case of the latter edge measuring operation mode. To be specific, when the pulse width adjusting circuit 100 operates in the main operation mode, the second delay signal is input into the reset terminal /R and OR circuits 54 and 56 are driven, so that a signal corresponding to the second delay signal is output through the positive output terminal Q. When the pulse width adjusting circuit 100 operates in the latter edge measuring operation mode, on the other hand, the second delay signal is input into the reset terminal /R and output from the negative output terminal /Q via the OR circuit 56. Since the path used in the main operation mode is different from the path used in the latter edge measuring operation mode as explained above, a skew is observed. Such a skew causes a minor error in the pulse width measurement. The buffer 58 has a function as a delay unit to reduce the skew. Having the described configuration, the pulse width adjusting circuit 100 can measure the pulse width more accurately.

Figure 8:
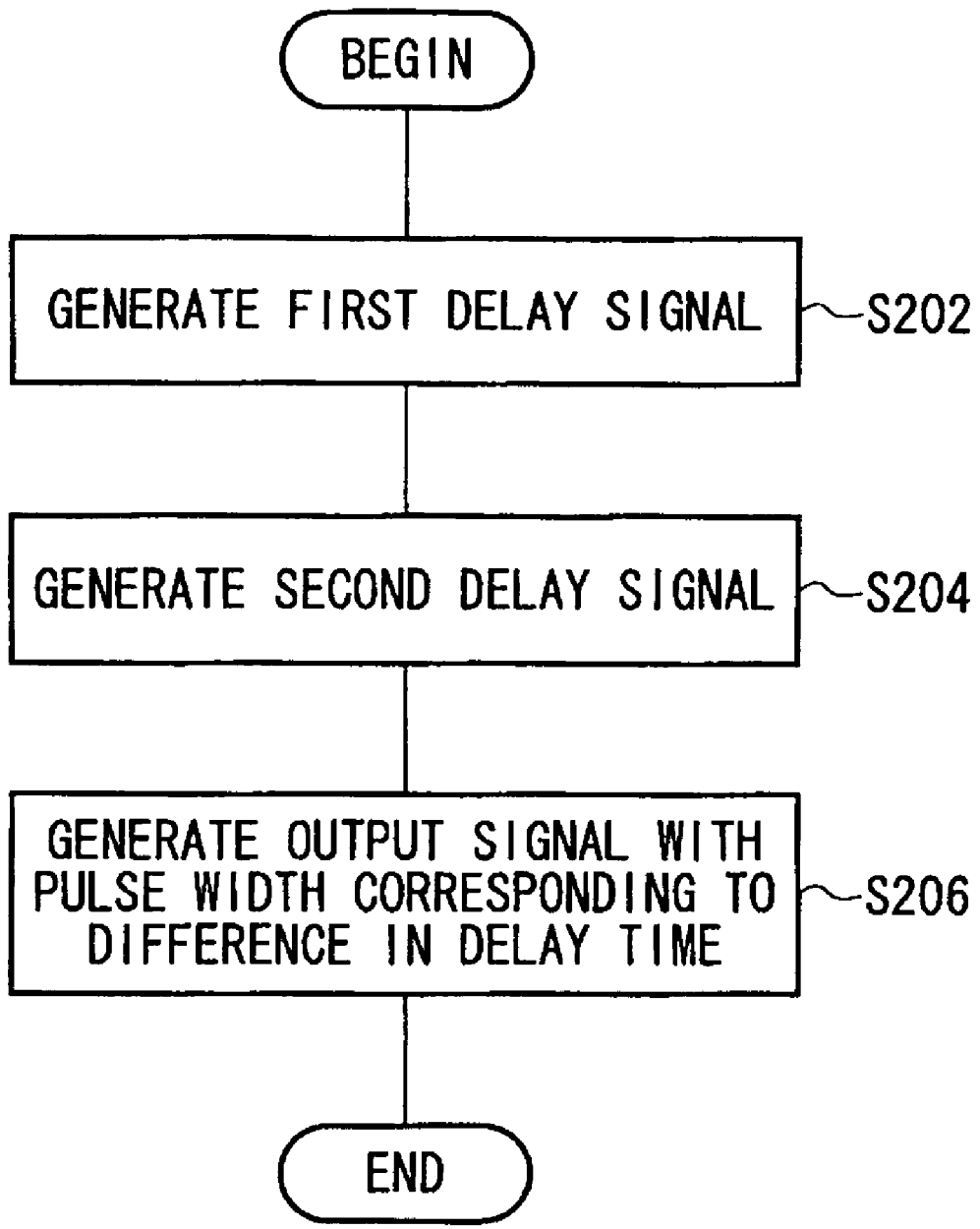
FIG. 8 is a flow chart illustrating an example of a pulse width adjusting method executed by using the pulse width adjusting circuit 100.

FIG. 8 is a flow chart illustrating an example of a pulse width adjusting method performed by using the pulse width adjusting circuit 100. The pulse width adjusting method may use all of the functions of the pulse width adjusting circuit 100 illustrated in FIGS. 4 to 7, to adjust and measure a pulse width. The following explains a method of adjusting a pulse width as an example.

In a first delay step S202, the first delay signal is generated by delaying the pulse signal supplied to the pulse width adjusting circuit 100. The step S202 may be executed by using the first delay circuit 12 illustrated in FIG. 5.

In a subsequent second delay step S204, the second delay signal is generated by delaying the supplied pulse signal by a different time from the first delay step. The step S204 may be executed by using the second delay circuit 18 illustrated in FIG. 5.

In a subsequent output step S206, the output signal having a pulse width corresponding to the difference in delay time between the first and second delay steps is generated in accordance with the first and second delay signals. The step S206 may be executed by using the output section 50 illustrated in FIG. 5.

According to the pulse width adjusting method described above, the pulse width can be controlled with the delay resolution of the second delay circuit 18, which has a higher resolution. At the same time, the output signal generated by the pulse width adjusting method has a pulse width smaller than the offset delay time of the second delay circuit 18.

The pulse width adjusting circuit 100 illustrated in FIGS. 4 to 7 may be used as a timing signal generating circuit to determine test timings, in a semiconductor test apparatus to test semiconductor circuits and the like.

Figure 9:
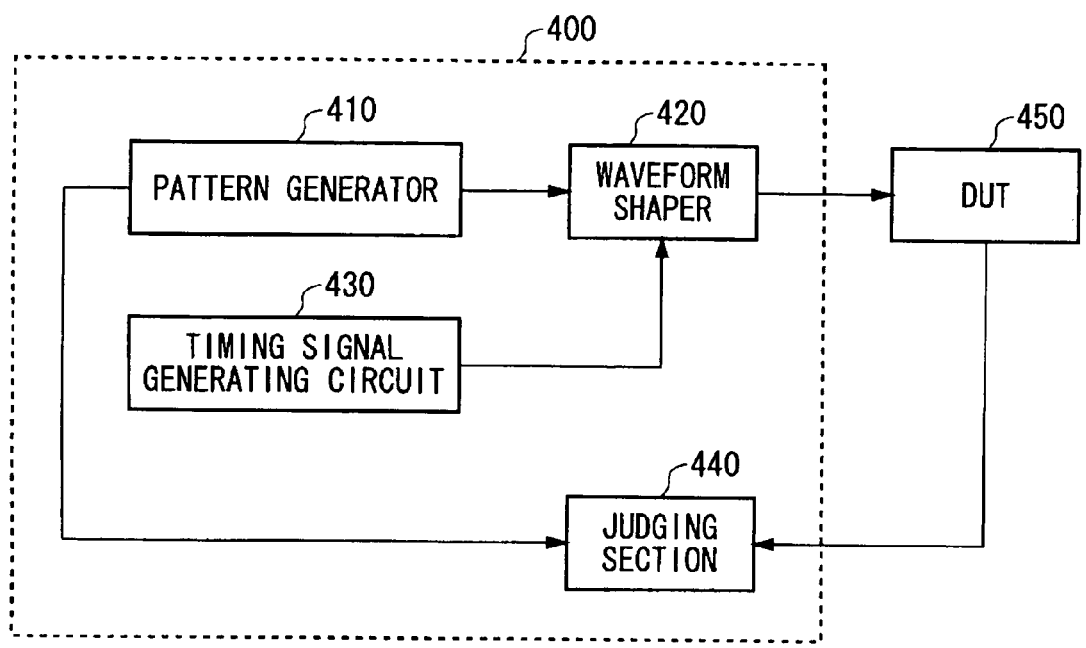
FIG. 9 illustrates an example of the configuration of a semiconductor test apparatus 400 that tests a semiconductor circuit 450.

FIG. 9 illustrates an example of the configuration of a semiconductor test apparatus 400 to test a semiconductor circuit 450. The semiconductor test apparatus 400 includes a pattern generator 410, a timing signal generating circuit 420, a waveform shaper 430 and a judging section 440.

The pattern generator 410 generates a test pattern to test the semiconductor circuit 450. The test pattern is, for example, a digital signal represented by a pattern of 1s and 0s. The waveform shaper 420 receives the test pattern, and shapes a test signal to be supplied to the semiconductor circuit 450 based on the received test pattern. For example, the waveform shaper 420 generates a test signal that has substantially the same phase as a timing signal supplied thereto, in synchronization with the supplied timing signal, and the generated test signal indicates a voltage level corresponding to a digital value of the test pattern.

The timing signal generating circuit 430 supplies a timing signal to the waveform shaper 420. Here, the timing signal generating circuit 430 generates the timing signal by adjusting the pulse width of a pulse signal supplied thereto so as to be equal to a predetermined width, and delaying each pulse of the supplied pulse signal to achieve a predetermined phase. The pulse signal is, for example, a rate signal having substantially the same cycle as the test cycle. The timing signal generating circuit 430 adjusts the pulse width of each pulse included in the pulse signal so as to be equal to a predetermined pulse width, and controls the phase of each pulse included in the pulse signal to achieve a desired phase.

The timing signal generating circuit 430 may have the same function and configuration as the pulse width adjusting circuit 100 illustrated in FIGS. 4 to 7. If such is the case, the pulse width adjusting section 10 adjusts the pulse width of each pulse included in the pulse signal, and the variable delay circuit 102 controls the phase of each pulse.

The judging section 440 judges whether the semiconductor circuit 450 is good or bad, based on an output signal output from the semiconductor circuit 450. The judging section 440 judges whether the semiconductor circuit 450 is good or bad, for example, by comparing the output signal with an expected value signal supplied from the pattern generator 410.

The semiconductor test apparatus 400 described above can accurately control the pulse width of the timing signal as illustrated with reference to FIGS. 4 to 7. As a consequence, the semiconductor test apparatus 400 can perform an accurate test on the semiconductor circuit 450.

While the present invention has been described with the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As clearly described above, the present invention can generate an output signal having a high-resolution pulse width, which is smaller than an offset delay time of a delay circuit. In addition, the present invention can accurately measure the pulse width of the output signal.

What is claimed is:

1. A pulse width adjusting circuit for generating an output signal by adjusting a pulse width of an input pulse signal and outputting the output signal, the pulse width adjusting circuit comprising:
   a first delay circuit to output a first delay signal generated by delaying the pulse signal by a certain delay time;
   a second delay circuit to output a second delay signal generated by delaying the pulse signal by a different delay time from the first delay circuit; and
   an output section to generate and output the output signal in accordance with the first and second delay signals, the output signal having a pulse width corresponding to a difference between the delay times respectively achieved by the first and second delay circuits.

2. The pulse width adjusting circuit according to claim 1, wherein
   the first and second delay circuits have different delay resolutions to delay the pulse signal.

3. The pulse width adjusting circuit according to claim 2, wherein
   the output section selects two edges of a same transiting direction respectively from the first and second delay signals, and generates a rising edge and a falling edge of the output signal in accordance with the selected two edges.

4. The pulse width adjusting circuit according to claim 1, wherein
   the output section includes
   a set-reset latch circuit to output an H-logic in accordance with the first delay signal and output an L-logic in accordance with the second delay signal, and
   the pulse width adjusting circuit further comprises
   a pre-pulse generator to receive the first and second delay signals, adjust pulse widths of the first and second delay signals so as to be substantially equal to each other and so that the first and second delay signals do not cause the set-reset latch circuit to operate simultaneously, and supply the first and second delay signals having the adjusted pulse widths to the set-reset latch circuit.

5. The pulse width adjusting circuit according to claim 4, further comprising
   a measuring section to measure the pulse width of the output signal, wherein
   the output section further passes the first and second delay signals output from the pre-pulse generator therethrough, and
   the measuring section includes:
   a loop unit to receive one of the first and second delay signals that is passed through the output section, adjust a pulse width of the received delay signal so as to be substantially equal to the pulse width of the pulse signal, and input the delay signal with the adjusted pulse width into the first and second delay circuits as the pulse signal;
   a cycle measuring section to measure a first loop cycle of a loop formed when the loop unit loops the first delay signal, and a second loop cycle of a loop formed when the loop unit loops the second delay signal; and
   a calculating section to calculate the pulse width of the output signal based on a difference between the first and second loop cycles.

6. The pulse width adjusting circuit according to claim 5, wherein
the pre-pulse generator includes:
a first pulse generator to adjust the pulse width of the first delay signal;
a second pulse generator to adjust the pulse width of the second delay signal;
a first control unit to control the first pulse generator so as to output one of the first delay signal the pulse width of which has been adjusted, the first delay signal the pulse width of which has not been adjusted, and a signal to cause the set-reset latch circuit to pass the second delay signal therethrough; and
a second control unit to control the second pulse generator so as to output one of the second delay signal the pulse width of which has been adjusted, the second delay signal the pulse width of which has not been adjusted, and a signal to cause the set-reset latch circuit to pass the first delay signal therethrough.

7. The pulse width adjusting circuit according to claim 6, wherein:
the pulse width adjusting circuit operates in one of a main operation mode to generate the output signal to be output to an external device, a former edge measuring operation mode to measure the first loop cycle, and a latter edge measuring operation mode to measure the second loop cycle;
when the pulse width adjusting circuit operates in the main operation mode,
the first control unit controls the first pulse generator to output the first delay signal the pulse width of which has been adjusted, and
the second control unit controls the second pulse generator to output the second delay signal the pulse width of which has been adjusted;
when the pulse width adjusting circuit operates in the former edge measuring operation mode,
the first control unit controls the first pulse generator to output the first delay signal the pulse width of which has not been adjusted, and
the second control unit controls the second pulse generator to output the signal to cause the set-reset latch circuit to pass the first delay signal therethrough; and
when the pulse width adjusting circuit operates in the latter edge measuring operation mode,
the first control unit controls the first pulse generator to output the signal to cause the set-reset latch circuit to pass the second delay signal therethrough, and
the second control unit controls the second pulse generator to output the second delay signal the pulse width of which has not been adjusted.

8. The pulse width adjusting circuit according to claim 7, wherein
the set-reset latch circuit includes
a delay unit, on a path to pass the second delay signal therethrough when the latter edge measuring operation mode is selected, to reduce a skew created between a path to generate the falling edge of the output signal in accordance with the second delay signal when the main operation mode is selected and the path to pass the second delay signal therethrough when the latter edge measuring operation mode is selected.

9. The pulse width adjusting circuit according to claim 8, wherein
the first pulse generator includes:
a first AND circuit to receive the first delay signal and output an inverse signal of a logical AND between the received first delay signal and a first control signal received from the first control unit;
a second AND circuit to receive an inverse signal of the first delay signal, and output an inverse signal of a logical AND between the received inverse signal of the first delay signal and a second control signal received from the first control unit;
a third delay circuit to delay the signal output from the second AND circuit; and
a third AND circuit to output an inverse signal of a logical AND between the signal output from the first AND circuit and the signal output from the third delay circuit, and
the first control unit:
outputs an H-logic as the first and second control signals when the pulse width adjusting circuit operates in the main operation mode;
outputs an L-logic as the first and second control signals when the pulse width adjusting circuit operates in the latter edge measuring operation mode; and
outputs an H-logic as one of the first and second control signals, and outputs an L-logic as the other control signal when the pulse width adjusting circuit operates in the former edge measuring operation mode.

10. The pulse width adjusting circuit according to claim 8, wherein
the second pulse generator includes:
a fourth AND circuit to receive the second delay signal and output an inverse signal of a logical AND between the received second delay signal and a third control signal received from the second control unit;
a fifth AND circuit to receive an inverse signal of the second delay signal, and output an inverse signal of a logical AND between the received inverse signal of the second delay signal and a fourth control signal received from the second control unit;
a fourth delay circuit to delay the signal output from the fifth AND circuit; and
a sixth AND circuit to output an inverse signal of a logical AND between the signal output from the fourth AND circuit and the signal output from the fourth delay circuit, and
the second control unit:
outputs an H-logic as the third and fourth control signals when the pulse width adjusting circuit operates in the main operation mode;
outputs an H-logic as one of the third and fourth control signals, and outputs an L-logic as the other control signal when the pulse width adjusting circuit operates in the latter edge measuring operation mode; and
outputs an L-logic as the third and fourth control signals when the pulse width adjusting circuit operates in the former edge measuring operation mode.

11. A pulse width adjusting method for generating an output signal by adjusting a pulse width of an input pulse signal and outputting the output signal, the pulse width adjusting method comprising:
generating a first delay signal by delaying the pulse signal by a certain delay time;
generating a second delay signal by delaying the pulse signal by a different delay time from the step of generating the first delay signal; and
generating and outputting the output signal in accordance with the first and second delay signals, the output signal having a pulse width corresponding to a difference between the delay times respectively achieved in the steps of generating the first and second delay signals.

12. The pulse width adjusting method according to claim 11, further comprising:
   measuring the delay time achieved in the step of generating the first delay signal;
   measuring the delay time achieved in the step of generating the second delay signal; and
   adjusting the delay times achieved in the steps of generating the first and second delay signals, based on the delay times measured in the steps of measuring the delay times achieved in the steps of generating the first and second delay signals, wherein
   the step of generating and outputting the output signal to an external device is performed after the step of adjusting the delay times.

* * * * *